US008046208B1

(12) United States Patent
Cai et al.

(10) Patent No.: US 8,046,208 B1
(45) Date of Patent: Oct. 25, 2011

(54) METHOD AND APPARATUS FOR REPRESENTING HIGH SPEED INTERCONNECTS IN CLOSED FORMS

(75) Inventors: Xiao-Ding Cai, Fremont, CA (US); Robert J. Drost, Los Altos, CA (US)

(73) Assignee: Oracle America, Inc., Redwood City, CA (US)

( * ) Notice: Subject to any disclaimer, the term of this patent is extended or adjusted under 35 U.S.C. 154(b) by 732 days.

(21) Appl. No.: 11/692,750

(22) Filed: Mar. 28, 2007

(51) Int. Cl.
*G06F 17/50* (2006.01)

(52) U.S. Cl. ......................................................... 703/13

(58) Field of Classification Search .................. 703/2, 13, 703/18; 324/66, 539, 543, 763; 333/1, 12; 257/241
See application file for complete search history.

(56) References Cited

U.S. PATENT DOCUMENTS

| 2003/0173978 | A1* | 9/2003 | Adamian et al. | 324/638 |
| 2008/0191818 | A1* | 8/2008 | Lee et al. | 333/247 |

OTHER PUBLICATIONS

Cai, Kevin, Sun Microsystems, "Closed Form Representations of High Speed Interconnects, Part A: 2-Port Cascaded S-Parameter and Group Delay (v0.7)" May 16, 2006, 21 pages.
Cai, Kevin, Sun Microsystems, "Closed Form Representations of High Speed Interconnects, Part B: 4-Port Cascaded S-Parameter (v0.3)" May 15, 2006, 26 pages.
Arabi, Tawfik Rahal et al. "On the Modeling of Conductor and Substrate Losses in Multiconductor, Multidielectric Transmission Line Systems," IEEE Transactions on Microwave Theory and Techniques, Jul. 1991, 39(7):1090-1097.
Zhong, Bing et al., "A Study of Hybrid Phase-Pole Macromodel for Transient Simulation of Complex Interconnects Structures," IEEE Transactions on Computer-Aided Design, Aug. 2005, 24(8):1250-1261.
Bockelman David E. et al., "Combined Differential and Common-Mode Scattering Parameters: Theory and Simulation," IEEE Transactions on Microwave Theory and Techniques, Jul. 1995, 43(7):1530-1539.
Bockelman, David E. et al., "Pure-Mode Network Analyzer for On-Wafer Measurements of Mixed-Mode S-Parameters of Differential Circuits," IEEE Transactions on Microwave Theory and Techniques, Jul. 1997, 45 (7):1071-1077.
Djordjevic, Antonije R. et al., "Wideband Frequency-Domain Characterization of FR-4 and Time Domain Causality," IEEE Transactions on Electromagnetic Compatibility, Nov. 2001, 43(4):662-667.
Miller, Edmund K., "Model-Based Parameter Estimation in Electromagnetics: Part I. Background and Theoretical Development," IEEE Antennas and Propagation Magazine, 1998, 40(1):42-52.
Engin, A. Ege et al., "Time-Domain Modeling of Lossy Substrates with Constant Loss Tangent," Proceedings of 8th IEEE Workshop on Signal Propagation on Interconnects, 2004, 151-154.
Nakhla, Natalie M. et al., "DEPACT: Delay Extraction-Based Passive Compact Transmission-Line Macromodeling Algorithm," IEEE Transactions Advanced Packaging, Feb. 2005, 28(1):13-23.

(Continued)

*Primary Examiner* — Paul Rodriguez
*Assistant Examiner* — Andre Pierre Louis
(74) *Attorney, Agent, or Firm* — Polsinelli Shughart PC

(57) ABSTRACT

A simulation apparatus and method is provided for simulating complex high speed interconnects for which closed forms of the S-parameter are incorporated. Differential transmission lines are represented in a causal manner analytically using the 4-port S-parameter without concerns of passivity and stability. Difficult discontinuities of interconnect such as differential vias are represented in closed form and the present invention allows those interconnects to be characterized by 4-port S-parameter measurements or simulation. A complete method of combining causal transmission line models with discontinuities in cascade is provided.

8 Claims, 6 Drawing Sheets

OTHER PUBLICATIONS

Xu, Qin-Wei et al., "Transient Analysis of Lossy Interconnects by Modified Method of Characteristics," IEEE Transactions on Circuit Systems—1: Fundamental Theory and Applications, Mar. 2000, 47(3):363-375.

Speciale, Ross A. "Even- and Odd-Mode Waves for Nonsymmetrical Coupled Lines in Nonhomogeneous Media," IEEE Transactions on Microwave Theory and Techniques, Nov. 1975, MTT-23(11):897-908.

Syverson, Seth L. et al., "Evaluation of Frequency-Dependent Transmission Line Model Extraction Methods Based on Laboratory Measurements," Proceedings of IEEE 2004 Electronic Components and Technology Conference, Jun. 2004, 2:i-ii,1416-1419.

Su, W. et al., "Crosstalk Analysis of Multisection Multiconductor Lines," IEEE Transactions Instrumentation Measurement, Dec. 1992, 41(6):926-931.

Cai, Xiao-Ding et al, "Time Domain Analysis of a Through Hole Via With Time Dependent Skin Effect Model," Proceedings of 1995 SBMO/IEEE MTT-S International Microwave and Optoelectronics Conference,1995, 2:862-867.

\* cited by examiner

| | |
|---|---|
| Establish a first set of explicit mathematical expressions for modeling causality into a computational software program to get dependencies for modeling causality | STEP 200 |
| Load real values for all parameters in the first set of explicit mathematical expressions into the software program | STEP 202 |
| Output a propagation constant that includes the effects of causality on the high speed interconnect | STEP 204 |
| Construct a Discontinuity-Line Model to model transmission line effects which expresses the S-parameter in closed forms and allows for cascading the high speed interconnect | STEP 206 |
| Derive a second set of explicit mathematical equations for the DLM model that take into account the propagation constant and transmission line effects where 4-port configuration and excitation are included | STEP 208 |
| Establish the second set of explicit mathematical equations into the software program to obtain the dependencies for transmission line effects | STEP 210 |
| Load real values for all parameters in the second explicit mathematical expressions into the software program | STEP 212 |
| Output the transmission line and discontinuity value for each 4-port segment | STEP 214 |
| Cascade the 4-port S-parameter of each segment directly and consecutively | STEP 216 |
| Obtain the final cascaded 4-port S-parameter in matrix format | STEP 218 |

FIG. 10

METHOD AND APPARATUS FOR REPRESENTING HIGH SPEED INTERCONNECTS IN CLOSED FORMS

FIELD OF THE INVENTION

The present invention relates to modeling and simulation of high speed interconnects using closed form representations of the S-parameter.

BACKGROUND OF THE INVENTION

High speed interconnects come in two types: single-ended and differential. High speed interconnects find their applications in high speed digital designs at three different levels: on-chip, IC package and PCB assembly. The latter includes cables and connectors that join systems. When a high speed signal passes through lossy interconnects, dispersion becomes visible causing signal degradation and eye closure. High speed interconnects are also reflective because of the discontinuities. The dispersive and reflective nature of the high speed interconnect may be observed at the level of PCB assembly. The higher the data speed, the more impact this nature exerts. High speed interconnects are difficult to model and conventional simulation tools for modeling high speed interconnects do not satisfy causality and are unreliable and inefficient.

BRIEF DESCRIPTION OF THE DRAWINGS

FIG. 10 is a block diagram showing the steps for analyzing high speed interconnects with differential lines and discontinuities.

DETAILED DESCRIPTION OF THE PREFERRED EMBODIMENTS

Figure 1:
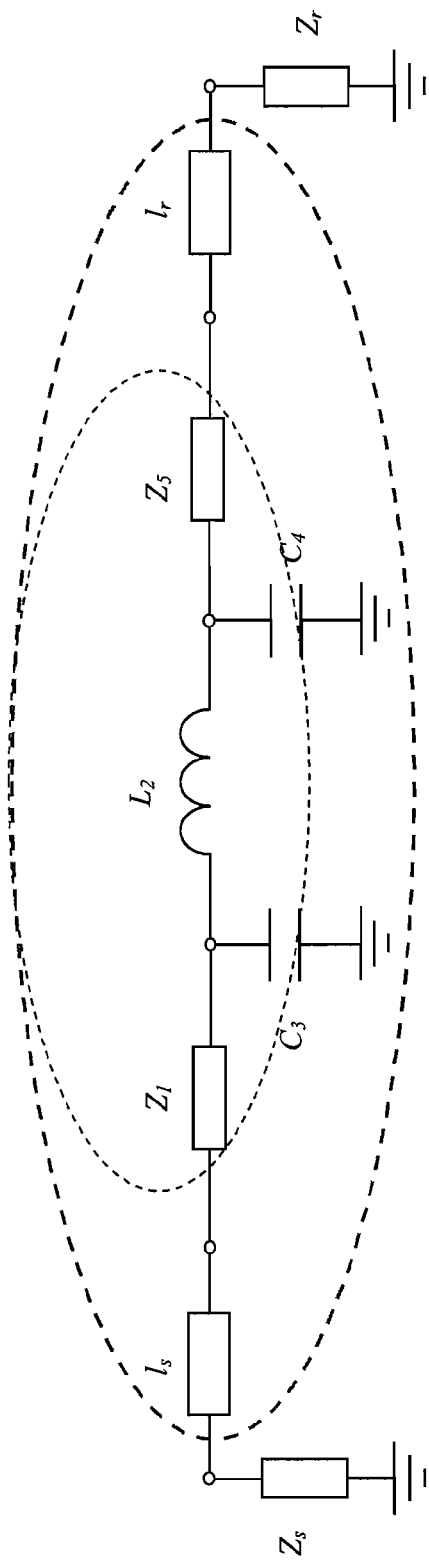
FIG. 1 illustrates a discontinuity-line model (DLM) within the outer dashed-line oval and a via model within the inner dashed-line model.

The following description is presented to enable any person skilled in the art to make and use the invention, and is provided in the context of particular applications of the invention and their requirements. Various modifications to the disclosed embodiments will be readily apparent to those skilled in the art and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Throughout the following specification, and in the claims, the term "circuit" means either a single component or a multiplicity of components, either active or passive, that are coupled or connected together to provide a desired function. Similar reference letters given to resistors and capacitors do not signify that these elements have the same values or types. While the present invention is described in relation to PCB structures, it is not to be limited thereto.

At the PCB level, both dispersion and reflection may cause high speed signal degradation, timing error and amplitude shrinkage. Discontinuities in an interconnect, e.g., vias, connectors and trace bends, may contribute to reflections degrading a transmitted signal. Of the signal impairments caused by the dispersion and reflection, timing errors have serious consequences in the high speed digital design area. Data jitter observed at the receive end is a form of the timing deviation, and timing error is a severe form of such deviation, which represents timing impairments contributed by the active parts and passive interconnects.

Group delay reveals the timing deviation, as well as its severe form, timing impairments, in the frequency domain. The group delay of a high speed interconnect system may be measured or calculated by simulating the relevant S-parameter using mathematical tools, such as, but not limited to, Matlab. Other commercial and industrial simulation tools providing similar functionality to Matlab will also suffice.

Conventional tools used to simulate the relevant S-parameter typically encounter efficiency and accuracy issues. As described in detailed below, the present invention, through the use of a closed form representation of the subject, overcomes such efficiency and accuracy issues. Closed form representations of a complex physical structure are efficient and accurate because, among other things, they address causality, which is typically ignored in conventional commercial analysis tools. The introduction of the causality in simulation tools brings jitter calculations much closer to measured data. The present invention extends treatments for the dielectric loss to the S-parameter representation, in which practical high speed interconnects may be expressed in closed forms. Upon this establishment, the group delay is derived in closed form, which is useful in the analysis of the impacts from dispersion and reflection.

Briefly stated, aspects of the invention relate to a method for the modeling and simulation of high speed interconnects using closed form representations of the S-parameter. Among other things, the method is particularly useful in efficiently and accurately representing a high speed interconnect with lossy single-ended or differential lines and discontinuities in closed forms. Closed forms solutions are computationally efficient in comparison with fitting or recursive fitting and other pure numerical matching processes. Further, causality may be addressed if frequency-dependent parameters are explicitly expressed with a proper formulation. By utilizing the S-parameter, the present invention provides a flexible process for allowing the differential interconnects to be cascaded.

The invention uses the single-ended interconnect system as an introductory example, but is not to be confined as such. Embodiments of the present invention may also be extended to differential interconnects, which are also provided in this invention.

Causality Representation and Complex Propagation Constant

In association with the loss tangent (called loss tan), dielectric constant is the ultimate parameter that displays the frequency dependency through the following formulation. The loss tan may be given as $$\tan_{loss} = \frac{\varepsilon''(\omega)}{\varepsilon'(\omega)} \quad \text{(equation 1)}$$

where ε' and ε" are the real and imaginary parts of the dielectric constant as in $$\epsilon(\omega) = \epsilon'(\omega) - j\cdot\epsilon''(\omega) \quad \text{(equation 2)}.$$

Following this formulation found in prior art, the real and imaginary parts of the relative dielectric constant may be expressed as $$\varepsilon_{r1}(f, \tau_1, \tau_2) = \varepsilon_{r0} + \frac{a}{2}\cdot\ln\left[\frac{\tau_2^2\cdot(1+\omega(f)^2\cdot\tau_1^2)}{\tau_1^2\cdot(1+\omega(f)^2\cdot\tau_2^2)}\right] \quad \text{(equation 3a)}$$

$$\epsilon_{r2}(f,\tau_1,\tau_2) = -a\cdot a\cdot[\arctan(\omega(f)\cdot\tau_2) - \arctan(\omega(f)\cdot\tau_1)] \quad \text{(equation 3b)}$$

where $\epsilon_{r1}$ and $\epsilon_{r2}$ (minus sign included) are the relative parts of ε' and ε", respectively, and $\tau_1$, $\tau_2$ and a are the empirical parameters, which may be determined by correlation with the experiments for a given medium, say, the FR4-type laminate. In equation 3a, $\epsilon_{r0}$ is the relative dielectric constant when the frequency approaches infinity, associated with the dielectric material system. The values for these parameters may be determined based on the type of fabrication process or from published data for the specific type of fabrication process. For exemplary purposes only, published data may be utilized for an FR4-type fabrication process. The loss tan given by equation 1 may be rewritten as $$\tan_{loss}(f, \tau_1, \tau_2) = \arctan\left[\frac{\varepsilon_{r2}(f, \tau_1, \tau_2)}{\varepsilon_{r1}(f, \tau_1, \tau_2)}\right]. \quad \text{(equation 4)}$$

With this formulation, the complex propagation constant may be shown to guarantee the causality on behalf of the dielectrics. The complex form of the propagation constant for a transmission line is $$\gamma(f, \tau_1, \tau_2) = \sqrt{\frac{(j\cdot\omega(f)\cdot L_0 + R(f))\cdot}{(j\cdot\omega(f)\cdot C(f, \tau_1, \tau_2))}}, \quad \text{(equation 5)}$$

where:

$$L_0 = Z_{00}\cdot\sqrt{\mu_0\cdot\varepsilon_0\cdot\varepsilon_{r0}} \quad \text{(equation 6)}$$

$$C(f, \tau_1, \tau_2) = C_0\cdot\frac{\varepsilon_r(f, \tau_1, \tau_2)}{\varepsilon_{r0}} \quad \text{(equation 7a)}$$

$$C_0 = \frac{\sqrt{\mu_0\cdot\varepsilon_0\cdot\varepsilon_{r0}}}{Z_{00}} \quad \text{(equation 7b)}$$

$$Z_{00} = \frac{60}{\sqrt{\varepsilon_{r0}}}\cdot\ln\left(\frac{1.9b}{0.8w+T}\right). \quad \text{(equation 8)}$$

$Z_{00}$ represents the characteristic impedance for a symmetrical stripline with T, b and w being the center conductor thickness, ground plane spacing and center conductor width, respectively. One of ordinary skill in the art will realize that a symmetrical stripline is used by way of example and the invention is not limited by this embodiment. For example, in another embodiment, $Z_{00}$ may represent the characteristic impedance of an offset stripline. The complex form of the propagation constant above (equation 5) includes both dielectric loss and conductive loss. It reveals the frequency dependency of the capacitance part C(f,τ1,τ2) and the resistance part R(f).

A further look at the conductive loss with the causality in mind leads to the following representation for R(f) in equation 5:

$$R(f) = R_{s0}\cdot(1+j)\cdot\sqrt{2\cdot\pi\cdot f} \quad \text{(equation 9)}$$

where $$R_{s0} = \frac{R_{dc}\cdot G_p}{\sqrt{2\cdot\pi\cdot f_s}}, \quad \text{(equation 10)}$$

$$R_{dc} = \frac{\rho}{w\cdot T} \quad \text{(equation 11)}$$

and $$f_s = \frac{4\cdot\rho}{T^2\cdot\pi\cdot\mu_0}. \quad \text{(equation 12)}$$

$G_p$ is a constant representing ground path multiplication, which is preferably less than or close to 2 as the return path through the ground plane is considered. In one embodiment, $f_s$ applies to the stripline structure only, as an example. $G_p$ may also be frequency dependent if surface roughness is considered. The resistivity ρ is the resistivity of the conductive material, e.g., copper, in this embodiment. Through a reformulation of equations 9 through 12, both temperature correction and surface roughness may be included.

Up to this point, equation 5 includes all causality concerns in the formulae. While the above equations devise a formulation for the stripline structure the present invention is not to be so limited and it does not exclude the possibility of modification for any other types of transmission line.

Discontinuity-Line Model (DLM)

With causality fully addressed in the complex propagation constant defined in the section above, the S-parameter may now be derived. It is beneficial to construct a topology in which the S-parameter may be expressed in closed form while maintaining the possibility of cascading for a complex yet practical interconnect structure. Those of skill in the art will appreciate that different topologies may be constructed for this purpose and the invention is not limited to this embodiment. However for purposes of clarity in explanation, this topology is chosen as one exemplary embodiment and shown in FIG. 1.

Referring to FIG. 1, the topology consists of two transmission lines, $l_s$ and $l_r$, respectively, attached as two arms to a π-shape circuit of the via model. Those of skill in the art will realize that multiple vias may come between $l_s$ and $l_r$. The circuit of FIG. 1 is a line to via model for a high speed interconnect. The via model comprises five elements: $Z_1$ through $Z_5$ each being of independent complex impedance, which may take any combination form of R, L and C, representing Resistor, Inductor, or Capacitor, respectively. For illustration purposes, only a simple π-model consisting of L and C with two impedances ($Z_1$ and $Z_5$) is attached on both sides, which could be two resistors. This elementary topology is a called Discontinuity-Line Model (DLM).

The DLM of FIG. 1 has two primary advantages: First, it allows for cascading the π-shape circuit of the through-hole via to address multi-layer via models at very high frequencies. This may assume the transmission lines attached at the arms are of zero length in FIG. 1 in one example. Secondly, when one of the transmission line lengths is zero, it may represent an end of the link with a via as the junction point for an IC package connection. Overall, the DLM allows many possible combinations of realistic and complex interconnects. This topology may be applied to both single-ended and differential high speed interconnection systems.

FIG. 1 displays a simple termination scheme with two impedances $Z_s$ and $Z_r$, which may be either a pure resistance or a complex form implying a shunt capacitance in parallel with a termination resistance. If the termination scheme has a few more components, a separate circuit representation may be used as a sub-network. The lengths of the transmission lines are denoted as $l_s$ and $l_r$, where the subscripts s and r represent sending end and receiving end.

The following derivation is based on the ABCD matrices and the DLM depicted in FIG. 1, which enables a closed form expression. As such the S-parameter is given for the sub-networks, which may be cascaded directly or indirectly through the ABCD matrices. Equations 13-20 are the preparation formulae before the final S-parameter is expressed by equations 21-24. Equations 13-24 shown below represent the entire via-line model shown in FIG. 1. All equations and formulas laid out in this detailed description may be modeled using a computational software tool such as Matlab. However, the invention is not limited by this embodiment. Any computational software tool may be used to model the equations and formulas laid out herein. The complex propagation constants associated with the transmission lines are $\gamma_s$ and $\gamma_r$, which are predetermined using equation 5. The system impedance is $Z_0$.

$$A(f, L_2, C_3, C_4) = \frac{[Z_3(f, C_3) \cdot Z_4(f, C_4) + Z_1 \cdot Z_4(f, C_4) + Z_1 \cdot Z_3(f, C_3) + Z_2(f, L_2) \cdot Z_3(f, C_3) + Z_1 \cdot Z_2(f, L_2)]}{Z_3(f, C_3) \cdot Z_4(f, C_4)} \quad \text{(equation 13)}$$

$$B(f, L_2, C_3, C_4) = \quad \text{(equation 14a)}$$

$$\frac{[Z_5 \cdot (Z_3(f, C_3) \cdot Z_4(f, C_4) + Z_1 \cdot Z_4(f, C_4) + Z_1 \cdot Z_3(f, C_3) + Z_2(f, L_2) \cdot Z_3(f, C_3) + Z_1 \cdot Z_2(f, L_2)) + B_b(f, L_2, C_3, C_4)]}{Z_3(f, C_3) \cdot Z_4(f, C_4)}$$

$$B_b(f,L_2,C_3,C_4) = Z_4(f,C_4) \cdot [Z_1 \cdot Z_3(f,C_3) + Z_2(f,L_2) \cdot Z_3(f,C_3) + Z_1 \cdot Z_2(f,L_2)] \quad \text{(equation 14b)}$$

$$C(f, L_2, C_3, C_4) = \frac{Z_2(f, L_2) + Z_3(f, C_3) + Z_4(f, C_4)}{Z_3(f, C_3) \cdot Z_4(f, C_4)} \quad \text{(equation 15)}$$

$$D(f, L_2, C_3, C_4) = \quad \text{(equation 16)}$$

$$\frac{[(Z_2(f, L_2) + Z_3(f, C_3) + Z_4(f, C_4)) \cdot Z_5 + (Z_2(f, L_2) + Z_3(f, C_3)) \cdot Z_4(f, C_4)]}{Z_3(f, C_3) \cdot Z_4(f, C_4)}.$$

All the above will be used in the following process. Further expansion with the ABCD parameters:

$$A_0(f,L_2,C_3,C_4,l_s,l_r) = T\_A_{01}(f,L_2,C_3,C_4,l_s,l_r) + T\_A_{02}(f, L_2,C_3,C_4,l_s,l_r) \quad \text{(equation 17a)}$$

$$T\_A_{01}(f,L_2,C_3,C_4,l_s,l_r) = [\cos h(\gamma_s(f) \cdot l_s) \cdot A(f,L_2,C_3,C_4) + Z_s \cdot \sin h(\gamma_s(f) \cdot l_s) \cdot C(f,L_2,C_3,C_4)] \cdot \cos h(\gamma_r(r) \cdot l_r, \quad \text{(equation 17b)}$$

$$T\_A_{02}(f, L_2, C_3, C_4, l_s, l_r) = [\cosh(\gamma_s(f) \cdot l_s) \cdot B((f, L_2, C_3, C_4) + Z_s \cdot \sinh(\gamma_s(f) \cdot l_s) \cdot D(f, L_2, C_3, C_4)] \cdot \frac{\sinh(\gamma_r(f) \cdot l_r)}{Z_r} \quad \text{(equation 17c)}$$

$$B_0(f,L_2,C_3,C_4,l_s,l_r) = T\_B_{01}(f,L_2,C_3,C_4,l_s,l_r) + T\_B_{02}(f, L_2,C_3,C_4,l_s,l_r) \quad \text{(equation 18a)}$$

$$T\_B_{01}(f,L_2,C_3,C_4,l_s,l_r) = [\cos h(\gamma_s(f) \cdot l_s) \cdot A(f,L_2,C_3,C_4) + Z_s \cdot \sin h(\gamma_s(f) \cdot l_s) \cdot C(f,L_2,C_3,C_4)] \cdot Z_r \cdot \sin h(\gamma_r(f) \cdot l_r) \quad \text{(equation 18b)}$$

$$T\_B_{02}(f,L_2,C_3,C_4,l_s,l_r) = [\cos h(\gamma_s(f) \cdot l_s) \cdot B(f,L_2,C_3,C_4) + Z_s \cdot \sin h(\gamma_s(f) \cdot l_s) \cdot D(f,L_2,C_3,C_4)] \cdot \cos h(\gamma_r(f) \cdot l_r) \quad \text{(equation 18c)}$$

$$C_0(f,L_2,C_3,C_4,l_s,l_r) = T\_C_{01}(f,L_2,C_3,C_4,l_s,l_r) + T\_C_{02}(f, L_2,C_3,C_4,l_s,l_r) \quad \text{(equation 19a)}$$

$$T\_C_{01}(f, L_2, C_3, C_4, l_s, l_r) = \left[\frac{\sinh(\gamma_s(f) \cdot l_s)}{Z_s} \cdot A(f, L_2, C_3, C_4) + \cosh(\gamma_s(f) \cdot l_s) \cdot C(f, L_2, C_3, C_4)\right] \cdot \cosh(\gamma_r(f) \cdot l_r) \quad \text{(equation 19b)}$$

$$T\_C_{02}(f, L_2, C_3, C_4, l_s, l_r) = \left[\frac{\sinh(\gamma_s(f) \cdot l_s)}{Z_s} \cdot B(f, L_2, C_3, C_4) + \right. \quad \text{equation 19c}$$

$$\cosh(\gamma_s(f) \cdot l_s) \cdot D(f, L_2, C_3, C_4) \Big] \cdot \frac{\sinh(\gamma_r(f) \cdot l_r)}{Z_r}$$

$$D_0(f, L_2, C_3, C_4, l_s, l_r) = T\_D_{01}(f, L_2, C_3, C_4, l_s, l_r) + T\_D_{02}(f, L_2, C_3, C_4, l_s, l_r) \quad \text{(equation 20a)}$$

$$T\_D_{01}(f, L_2, C_3, C_4, l_s, \quad \text{(equation 20b)}$$

$$l_r) = \left[ \frac{\sinh(\gamma_s(f) \cdot l_s)}{Z_s} \cdot A(f, L_2, C_3, C_4) + \cosh(\gamma_s(f) \cdot l_s) \cdot C(f, L_2, C_3, C_4) \right] \cdot Z_r \cdot \sinh(\gamma_r(f) \cdot l_r)$$

$$T\_D_{02}(f, L_2, C_3, C_4, l_s, \quad \text{(equation 20c)}$$

$$l_r) = \left[ \frac{\sinh(\gamma_s(f) \cdot l_s)}{Z_s} \cdot B(f, L_2, C_3, C_4) + \cosh(\gamma_s(f) \cdot l_s) \cdot D(f, L_2, C_3, C_4) \right] \cdot \cosh(\gamma_r(f) \cdot l_r)$$

The S-parameter for the DLM is shown below, which is also called Single Section S-Parameter because the preparing forms given above are ready to be cascaded through the ABCD matrices.

$$S_{21}(f, L_2, C_3, C_4, l_s, l_r) = \quad \text{(equation 21)}$$

$$\frac{2 \cdot Z_0}{[A_0(f, L_2, C_3, C_4, l_s, l_r) + C_0(f, L_2, C_3, C_4, l_s, l_r) \cdot Z_0 + D_0(f, L_2, C_3, C_4, l_s, l_r)] \cdot Z_0 + B_0(f, L_2, C_3, C_4, l_s, l_r)}$$

$$S_{11}(f, L_2, C_3, C_4, l_s, l_r) = \quad \text{(equation 22)}$$

$$\frac{[A_0(f, L_2, C_3, C_4, l_s, l_r) - C_0(f, L_2, C_3, C_4, l_s, l_r) \cdot Z_0 - D_0(f, L_2, C_3, C_4, l_s, l_r)] \cdot Z_0 + B_0(f, L_2, C_3, C_4, l_s, l_r)}{[A_0(f, L_2, C_3, C_4, l_s, l_r) + C_0(f, L_2, C_3, C_4, l_s, l_r) \cdot Z_0 + D_0(f, L_2, C_3, C_4, l_s, l_r)] \cdot Z_0 + B_0(f, L_2, C_3, C_4, l_s, l_r)}$$

$$S_{12}(f, L_2, C_3, C_4, l_s, l_r) = \quad \text{(equation 23)}$$

$$\frac{[A_0(f, L_2, C_3, C_4, l_s, l_r) \cdot D_0(f, L_2, C_3, C_4, l_s, l_r) - B_0(f, L_2, C_3, C_4, l_s, l_r)] \cdot C_0(f, L_2, C_3, C_4, l_s, l_r) \cdot 2 \cdot Z_0}{[A_0(f, L_2, C_3, C_4, l_s, l_r) + C_0(f, L_2, C_3, C_4, l_s, l_r) \cdot Z_0 + D_0(f, L_2, C_3, C_4, l_s, l_r)] \cdot Z_0 + B_0(f, L_2, C_3, C_4, l_s, l_r)}$$

$$S_{22}(f, L_2, C_3, C_4, l_s, l_r) = \quad \text{(equation 24)}$$

$$\frac{[-A_0(f, L_2, C_3, C_4, l_s, l_r) - C_0(f, L_2, C_3, C_4, l_s, l_r) \cdot Z_0 + D_0(f, L_2, C_3, C_4, l_s, l_r)] \cdot Z_0 + B_0(f, L_2, C_3, C_4, l_s, l_r)}{[A_0(f, L_2, C_3, C_4, l_s, l_r) + C_0(f, L_2, C_3, C_4, l_s, l_r) \cdot Z_0 + D_0(f, L_2, C_3, C_4, l_s, l_r)] \cdot Z_0 + B_0(f, L_2, C_3, C_4, l_s, l_r)}$$

Cascaded Multiple DLM's

Figure 2:
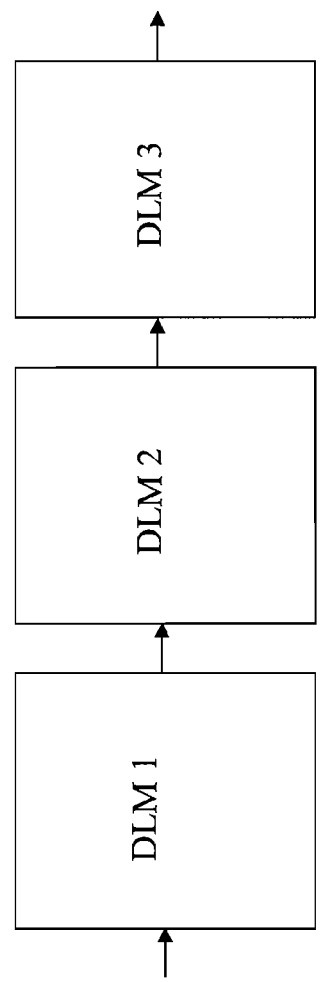
FIG. 2 is a block diagram of a cascaded DLM.

When cascading several DLM's together, the final S-parameter results from the cascaded multiple DLM's. FIG. 2 illustrates a triple DLM cascade structure which may be used to model a "via-line-via" or a more complex configuration. There are several different ways of handling the cascading. The first way is to use the S-parameter directly for cascading. The second is to go through the ABCD matrix conversion while keeping the closed forms in the fashion of ABCD parameters before converting to the final S-parameter. Other ways include utilizing commercial tools that are capable of cascading the S-parameter. For increasing the via modeling accuracy, a number of DLM's may be cascaded to form one via model as the bandwidth demands. Since both lumped elements and transmission lines are included in the DLM, it is therefore possible to use the transmission line models inside the DLM for another refined way of the via modeling. This integrated closed form representation of via and transmission lines to the differential structure may be further applied, where a special treatment of the differential via using the DLM concept is introduced.

One connotation that has been made here is that the resulted responses from the closed forms have guaranteed the causality. The relationship between the group delay and the combined effects of dispersion and reflection may be found. The phase delay is given as $$P_d(\omega) = -\frac{\Theta(\omega)}{\omega}.$$

The group delay is given as $$G_d(\omega) = -\frac{d\,\Theta(\omega)}{d\,\omega}$$

where $\Theta(\omega)$ is me phase of the transfer function, which may be represented by the S-parameter. For a high speed digital signal, its bandwidth has become so large that the phase linearity may no longer hold true in most of the practical interconnects.

Both dispersion and reflection contribute to the group delay variation. One advantage of developing the closed forms of the group delay is that it allows an easy separation of the two mechanisms that are causing signal distortion: dispersion and reflection. Its dependency upon the transmission line properties and discontinuities is explicitly given by equations 21-24 above. The embodiment of the separation described above is applicable to both single-ended and differential S-parameters derived in this invention.

Figure 3:
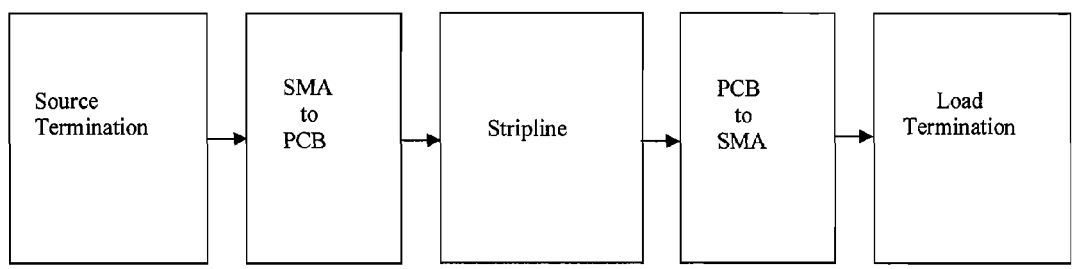
FIG. 3 is a test bed/validation setup for both measurement and simulation in accordance with an embodiment of the present invention.

FIG. 3 shows a test bed/validation setup for both measurement and simulation. The closed form representation of the single-ended high speed interconnect allow the impact from dispersion and reflection to be viewed in different ways. Potential signal impairments caused by these two factors are revealed in the fashion of group delay variations against frequency.

The group delay derived from the S-parameter in this way has significant and beneficial uses. The closed form formulation may show and aid in investigating the reflection impact on the group delay, reflection impact caused by different transmission line configurations, source and load impedances, and other forms of discontinuities.

Using single-ended interconnect for revealing the causality treatment and group delay variations is achieved with the closed form formulation as an efficient and accurate means. Formulating the S-parameter in closed forms and enabling it readily cascadable makes the approach useful not only for the single-ended case but also for the differential case. Described in detail below, is a closed form approach to coupled high speed interconnects where a practical 4-port transmission system is represented without fitting or recursive computing algorithms.

4-Port Cascaded S-Parameter

In accordance with a second embodiment of the present invention, the above described method is extended for the 4-Port S-parameter formulation in closed forms for practical high speed differential interconnect systems. The interconnect system consists of coupled vias and coupled transmission lines. The coupled structures are designed to transmit high speed differential signals. The cascaded structure of vias and transmission lines may represent a typical topology for high speed data transmission systems. In accordance with further embodiments and arrangements of the present invention, any well designed high speed connectors and cables could be thought of as part of the transmission lines while the discontinuity part may be treated through the DLM. For purpose of illustration, assume that the interconnect system may be treated as an LTI (Linear Time Invariant) system.

Figure 4:
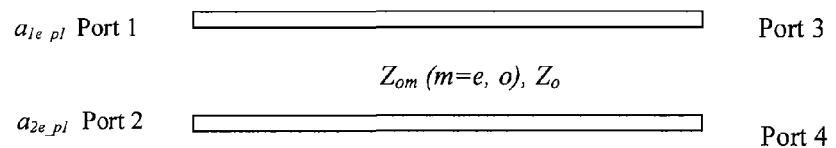
FIG. 4 is a 4-port network with port designation showing even mode excitations at Port 1 and Port 2 with reference to Port 1.

Referring to FIG. 4, there are at least three different port definitions for a 4-port system, which are Instance 1: P1 and P2 on side 1 and P3 and P4 on side 2; Instance 2: P1 and P3 on side 1 and P2 and P4 on side 2; and Instance 3: P1 and P4 on side 1 and P2 and P3 on side 2. P1, P2, P3 and P4 represent the ports and the one to one correspondence between ports on both sides is assumed. Here, Instance 1 is chosen as one embodiment for the port number designation.

For a 4-port network, port excitation has to be given with reference to other ports involved. In accordance with embodiments of the present invention, the port excitation may be rotated one port after the other. However, the canonical port numbering described earlier for future expansion purposes is used.

The port excitation is first referenced to port 1 with the same side inputs $a_1$ and $a_2$, whose mode identification and port reference are marked as the subscripts. For example, $a_{1e\_p1}$ refers to port 1 excitation in even mode referenced to port 1 and $a_{1o\_p2}$ port 1 excitation in odd mode referenced to port 2. The below port excitation equation is derived from FIG. 4 where $a_1=2$.

$$\begin{bmatrix} a_{1e\_p1} & a_{1o\_p1} \\ a_{2e\_p1} & a_{2o\_p1} \end{bmatrix} = \begin{bmatrix} 1 & 1 \\ 1 & -1 \end{bmatrix} \quad \text{(equation 25)}$$

For all 4-port responses under the defined excitation, the S-parameter may be given as:

$$s_{11}(f) = \frac{1}{a_1}(s_{11_e}(f) \cdot a_{1e\_p1} + s_{11_o}(f) \cdot a_{1o\_p1}) \quad \text{(equation 26)}$$

$$s_{21}(f) = \frac{1}{a_1}(s_{22_e}(f) \cdot a_{2e\_p1} + s_{22_o}(f) \cdot a_{2o\_p1}) \quad \text{(equation 27)}$$

$$s_{31}(f) = \frac{1}{a_1}(s_{31_e}(f) \cdot a_{1e\_p1} + s_{31_o}(f) \cdot a_{1o\_p1}) \quad \text{(equation 28)}$$

$$s_{41}(f) = \frac{1}{a_1}(s_{42_e}(f) \cdot a_{2e\_p1} + s_{42_o}(f) \cdot a_{2o\_p1}) \quad \text{(equation 29)}$$

where, $$S_{11_m}(f) = S_{22_m}(f) = \frac{(Z_{om}^2 - Z_o^2) \cdot \sinh(\gamma_m(f, \tau_1, \tau_2) \cdot l_T)}{(Z_{om}^2 + Z_o^2) \cdot \sinh(\gamma_m(f, \tau_1, \tau_2) \cdot l_T + 2Z_{om} \cdot Z_o \cdot \cosh(\gamma_m(f, \tau_1, \tau_2,) \cdot l_T)} \quad \text{(equation 30)}$$

$$S_{31_m}(f) = S_{42_m}(f) = \frac{2Z_{om} \cdot Z_o}{(Z_{om}^2 + Z_o^2) \cdot \sinh(\gamma_m(f, \tau_1, \tau_2) \cdot l_T) + 2Z_{om} \cdot Z_o \cdot \cosh(\gamma_m(f, \tau_1, \tau_2) \cdot l_T)} \quad \text{(equation 31)}$$

and m=e, o, indicating even or odd mode. $\beta_m(f,\tau_1,\tau_2)$ is the complex propagation constant with the mode identification, where $\tau_1$ and $\tau_2$ are the parameters determined for the dielectric material system. This is where the causality is addressed fully in the closed form representation for both skin effect and dielectric losses $l_T$ is the transmission line length for the specified section. $Z_o$ is the system characteristic impedance and $Z_{om}$ the even and odd mode impedances for the same transmission line section. $Z_{om}$ may be calculated using conventional formulas known in the art.

The same process (shown below) is carried over for Port 2 as the reference of excitation where $a_2=2$.

$$\begin{bmatrix} a_{1e\_p2} & a_{1o\_p2} \\ a_{2e\_p2} & a_{2o\_p2} \end{bmatrix} = \begin{bmatrix} 1 & -1 \\ 1 & 1 \end{bmatrix} \quad \text{(equation 32)}$$

$$S_{12}(f) = \frac{1}{a_2}(S_{11_e}(f) \cdot a_{1e\_p2} + S_{11_o}(f) \cdot a_{1o\_p2}) \quad \text{(equation 33)}$$

$$S_{22}(f) = \frac{1}{a_2}(S_{22_e}(f) \cdot a_{2e\_p2} + s_{22_o}(f) \cdot a_{2o\_p2}) \quad \text{(equation 34)}$$

$$S_{32}(f) = \frac{1}{a_2}(S_{31_e}(f) \cdot a_{1e\_p2} + S_{31_o}(f) \cdot a_{1o\_p2}) \quad \text{(equation 35)}$$

$$S_{42}(f) = \frac{1}{a_2}(S_{42}(f) \cdot a_{2e\_p2} + S_{42_o}(f) \cdot a_{2o\_p2}) \quad \text{(equation 36)}$$

The same process is carried over for Port 3 as the reference of excitation where $a_3=2$.

$$\begin{bmatrix} a_{3e\_p3} & a_{3o\_p3} \\ a_{4e\_p3} & a_{4o\_p3} \end{bmatrix} = \begin{bmatrix} 1 & 1 \\ 1 & -1 \end{bmatrix} \quad \text{(equation 37)}$$

$$S_{13}(f) = \frac{1}{a_3}(S_{13_e}(f) \cdot a_{3e\_p3} + S_{13_o}(f) \cdot a_{3o\_p3}) \quad \text{(equation 38)}$$

$$S_{23}(f) = \frac{1}{a_3}(S_{24_e}(f) \cdot a_{4e\_p3} + S_{24_o}(f) \cdot a_{4o\_p3}) \quad \text{(equation 39)}$$

$$S_{33}(f) = \frac{1}{a_3}(S_{33_e}(f) \cdot a_{3e\_p3} + S_{33_o}(f) \cdot a_{3o\_p3}) \quad \text{(equation 40)}$$

$$S_{43}(f) = \frac{1}{a_3}(S_{44_e}(f) \cdot a_{4e\_p3} + S_{44_o}(f) \cdot a_{4o\_p3}) \quad \text{(equation 41)}$$

where $$S_{33_m}(f) = S_{44_m}(f) = S_{11_m}(f) \quad \text{(equation 42)}$$

$$S_{13_m}(f) = S_{24_m}(f) = S_{31_m}(f) \quad \text{(equation 43)}$$

Note that uniform section is assumed, meaning that the line geometrical properties do not change with the length. The same process is carried over for Port 4 (shown below) as the reference of excitation with $a_4=2$.

$$\begin{bmatrix} a_{3e\_p4} & a_{3o\_p4} \\ a_{4e\_p4} & a_{4o\_p4} \end{bmatrix} = \begin{bmatrix} 1 & -1 \\ 1 & 1 \end{bmatrix} \quad \text{(equation 44)}$$

$$S_{14}(f) = \frac{1}{a_4}(S_{13_e}(f) \cdot a_{3e\_p4} + S_{13_o}(f) \cdot a_{3o\_p4}) \quad \text{(equation 45)}$$

$$S_{24}(f) = \frac{1}{a_4}(S_{24_e}(f) \cdot a_{4e\_p4} + S_{24_o}(f) \cdot a_{4o\_p4}) \quad \text{(equation 46)}$$

$$S_{34}(f) = \frac{1}{a_4}(S_{33_e}(f) \cdot a_{3e\_p4} + S_{33_o}(f) \cdot a_{3o\_p4}) \quad \text{(equation 47)}$$

$$S_{44}(f) = \frac{1}{a_4}(S_{44_e}(f) \cdot a_{4e\_p4} + S_{44_o}(f) \cdot a_{4o\_p4}) \quad \text{(equation 48)}$$

The final summed S-parameter in closed form per one section is:

$$[S(f)] = \begin{bmatrix} S_{11}(f) & S_{12}(f) & S_{13}(f) & S_{14}(f) \\ S_{21}(f) & S_{22}(f) & S_{23}(f) & S_{24}(f) \\ S_{31}(f) & S_{32}(f) & S_{33}(f) & S_{34}(f) \\ S_{41}(f) & S_{42}(f) & S_{43}(f) & S_{44}(f) \end{bmatrix} \quad \text{(equation 49)}$$

Equation 49 is the master assembled equation for modeling all four ports. All the above equations may be loaded into a computational software suite, such as, but not limited to, Matlab. Values are then plugged into equations and the resulting S-parameter representation is given by equation 49. The completeness of our model may be implemented by introducing the lumped model of FIG. 5 for the via represented by equations 50 and 51 (explained in detail below) into the DLM.

Via representation in circuit terms may be either a π-shape low-pass filter or a T-shape one. For exemplary purposes, π-shape may be used, however the present invention is not limited to this embodiment. For example, in another embodiment, the invention may be equally applied to the T-shape filter, or the like. To maintain a simple structure while not sacrificing the accuracy within a suitable frequency range, a single π-model may be used. This model may be combined with the differential transmission lines to form a practical high speed interconnect.

Figure 5:
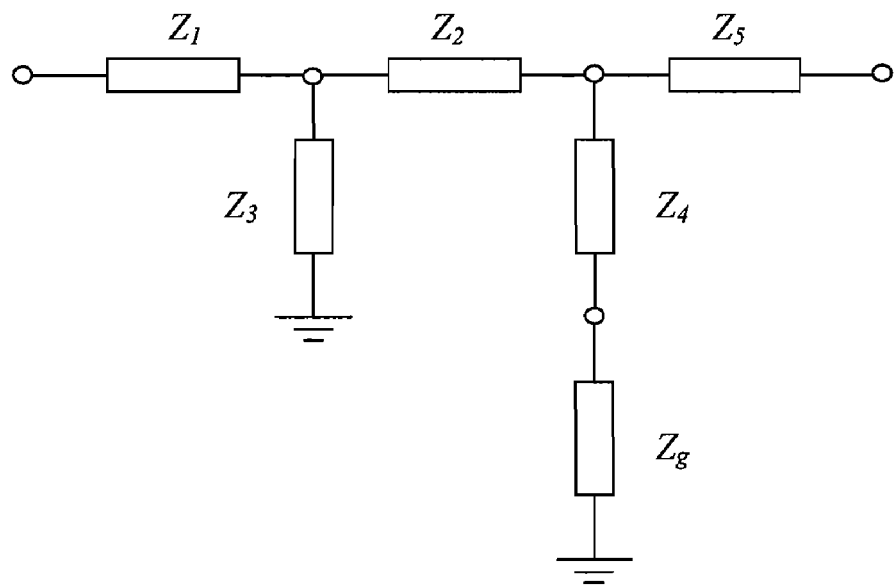
FIG. 5 is a π-model of the RLC circuit for one leg of the differential via.

Coupled lumped via model in terms of RLC circuits is one arrangement. The lumped model would only account for the loss part of the via leaving the coupling part to the following treatment. FIG. 5 is a π-model of the RLC circuit for one leg of the differential via, where $Z_i$ ($i=1, 2, \ldots, 5$) and $Z_g$ are the impedances representing the physical model within a reasonable frequency range.

Differential vias are widely used in conjunction with the differential transmission lines. For thick PCB boards with a multi-layer stack-up, it is desirable to have a closed form representation of the differential vias in terms of their signal interacting properties. Approximation may be used to give a practical mathematical form with an acceptable degree of accuracy for the interested frequency range.

Figure 6:
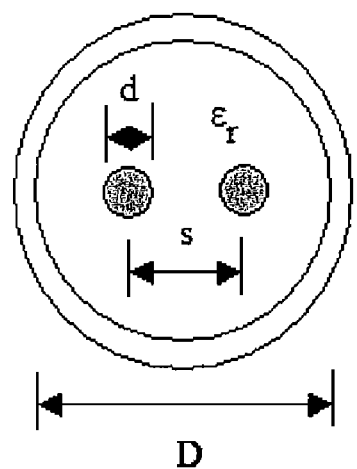
FIG. 6 is a cross-section of a twinax structure.

FIG. 6 is a uniform section of a twinax structure, the two center conductors represent the differential vias in the PCB environment. The outer conductor with its geometrical size D and the length $l_v$ (not shown, but is directed into the plain of the paper) may be adjusted to accommodate the layout reality, design and intended purpose. The outer diameter D and the length $l_v$ are associated with the vias and their surrounding ground structure, which may be assessed on an equivalent basis. FIG. 6 also shows the inner diameter d, spacing s and dielectric constant.

Equations 50 and 51, found in prior art, below are one embodiment for a differential pair of via that may be treated in closed forms. Both odd and even mode impedances are provided below, which are the basis for the 4-port S-parameter formulation, as given by equation 25.

$$z_{vo} = \frac{\eta_0}{\pi \cdot \sqrt{\varepsilon_r}} \cdot \left[ \ln\left( \frac{2s}{d} \cdot \frac{1-\left(\frac{s}{D}\right)^2}{1+\left(\frac{s}{D}\right)^2} \right) - \right. \qquad \text{(equation 50)}$$

$$\left. \left[ \frac{\left(1+4\cdot\left(\frac{s}{d}\right)^2\right)\cdot\left(1-4\cdot\left(\frac{s}{D}\right)^2\right)}{16\cdot\left(\frac{s}{d}\right)^4} \right] \right]$$

$$Z_{ve} = \frac{\eta_0}{2\pi \cdot \sqrt{\varepsilon_r}} \cdot \left[ \ln\left( \frac{\frac{s}{d}}{2\cdot\left(\frac{s}{D}\right)^2} \cdot \left[1-\left(\frac{s}{D}\right)^4\right] \right) \right] \qquad \text{(equation 51)}$$

To simplify the process for obtaining the complex propagation constant for the twinax structure in FIG. 6, the loss part may be omitted while it may be represented by the lumped circuits described earlier. The formulation herein is to compensate the coupling effect that is seen in the differential via portion. Since the geometrical parameters for the via and stack-up are known, the above odd and even mode impedances may be calculated with the inclusion of the expected coupling.

Practical high speed interconnect systems consist of multi-segment or multi-port coupled subsystems. Each segment is considered multi-port transmission line sections, which may be uniform or non-uniform. The junction point connecting the segments is usually the vias or other discontinuities, which may be treated as a new segment. To perform a point to point interconnect link analysis, the segments and discontinuities may be cascaded with vias represented by S-parameter.

Figure 7:
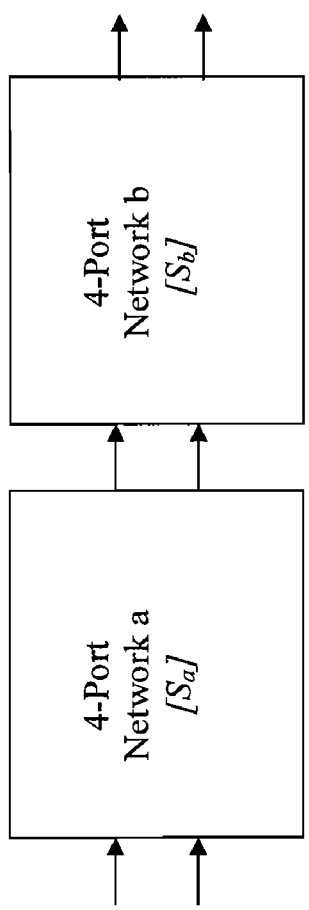
FIG. 7 illustrates 4-port networks as cascaded segments.

Without losing the generality, FIG. 7 illustrates a cascading 4-port S-parameter. The approach provided here does not limit the number of segments for cascading. FIG. 7 shows two segments of 4-port networks concatenated in a series fashion. More segments may be cascaded in the same way.

Referring to FIG. 7, the final cascaded S-parameter for the two series-connected networks is:

$$S_{S_{11}}(f) = S_{A_{11}}(f) + S_{A_{11}}(f) + S_{A_{12}}(f) \cdot [[I] - S_{B_{11}}(f) \cdot S_{A_{22}}(f)]^{-1} \cdot S_{B_{11}}(f) \cdot S_{A_{21}}(f) \qquad \text{(equation 52)}$$

$$S_{S_{12}}(f) = S_{A_{12}}(f) \cdot [[I] - S_{B_{11}}(f) \cdot S_{A_{22}}(f)]^{-1} \cdot S_{B_{12}}(f) \qquad \text{(equation 53)}$$

$$S_{S_{21}}(f) = S_{B_{21}}(f) \cdot [[I] - S_{B_{11}}(f) \cdot S_{A_{22}}(f)]^{-1} \cdot S_{A_{21}}(f) \qquad \text{(equation 54)}$$

$$S_{S_{22}}(f) = S_{B_{22}}(f) + S_{B_{21}}(f) \cdot [[I] - S_{B_{11}}(f) \cdot S_{A_{22}}(f)]^{-1} \cdot S_{A_{22}}(f) \cdot S_{B_{12}}(f) \qquad \text{(equation 55)}$$

where [I] is the unit 2×2 matrix. In equations 52-55, $[S_{S11}(f)]$, $[S_{S12}(f)]$, $[S_{S21}(f)]$, and $[S_{S22}(f)]$ and $[S_{S22}(f)]$ are 2×2 matrices as the cascaded S-parameter for the segmented S-parameter $[S_A(f)]$ and $[S_B(f)]$. The latter ones are given as below, respectively:

$$s_{A11}(f) = \begin{bmatrix} s_{a11}(f) & s_{a12}(f) \\ s_{a21}(f) & s_{a22}(f) \end{bmatrix} \qquad \text{(equation 56)}$$

$$s_{A12}(f) = \begin{bmatrix} s_{a13}(f) & s_{a14}(f) \\ s_{a23}(f) & s_{a24}(f) \end{bmatrix} \qquad \text{(equation 57)}$$

$$s_{A21}(f) = \begin{bmatrix} s_{a31}(f) & s_{a32}(f) \\ s_{a41}(f) & s_{a42}(f) \end{bmatrix} \qquad \text{(equation 58)}$$

$$s_{A22}(f) = \begin{bmatrix} s_{a33}(f) & s_{a34}(f) \\ s_{a43}(f) & s_{a44}(f) \end{bmatrix} \qquad \text{(equation 59)}$$

and $$s_{B11}(f) = \begin{bmatrix} s_{b11}(f) & s_{b12}(f) \\ s_{b21}(f) & s_{b22}(f) \end{bmatrix} \qquad \text{(equation 60)}$$

$$s_{B12}(f) = \begin{bmatrix} s_{b13}(f) & s_{b14}(f) \\ s_{b23}(f) & s_{b24}(f) \end{bmatrix} \qquad \text{(equation 61)}$$

$$s_{B21}(f) = \begin{bmatrix} s_{b31}(f) & s_{b32}(f) \\ s_{b41}(f) & s_{b42}(f) \end{bmatrix} \qquad \text{(equation 62)}$$

$$s_{B22}(f) = \begin{bmatrix} s_{b33}(f) & s_{b34}(f) \\ s_{b43}(f) & s_{b44}(f) \end{bmatrix} \qquad \text{(equation 63)}$$

where $[S_a(f)]$ and $[S_b(f)]$ are 4×4 matrices with their elements given either by equation 49 in closed forms or by measurements while $[S_A(f)]$ and $[S_B(f)]$ are 2×2 matrices.

Figure 8:
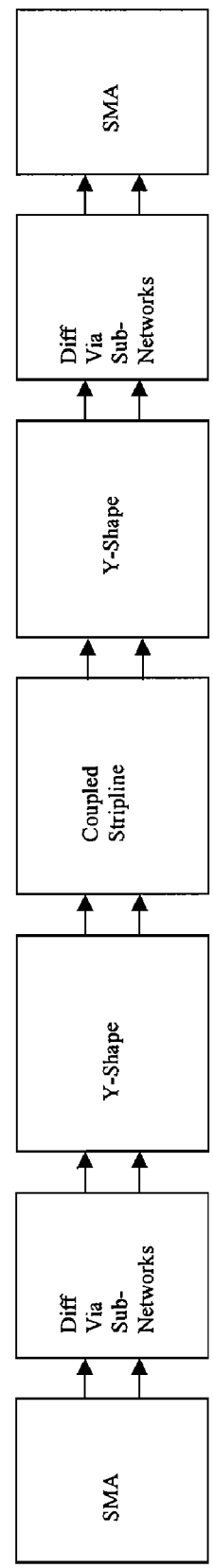
FIG. 8 illustrates cascaded 4-port networks for simulation of a length of coupled stripline.

In one embodiment, a simulation approach may be used to emulate the entire physical structure including SMA connector, via, Y-shape transition and coupled differential traces from end to end. FIG. 8 depicts the cascaded differential networks from the left side connector (SMA connector) to the right side one. The mathematical representation of the source termination is fed into an SMA connector of the PCB board. Those of skill in the art will realize that coupled stripline is the transmission line and that other connector besides SMA connectors could also be used in FIG. 8. The SMA connector may be simulated with an uncoupled stripline of a proper impedance for length matching purposes, as a simplified example. The Differential Via component consists of two sub-networks: one with the coupled twinax structure for via coupling and the other with the π-model described earlier for the via loss representation. The Y-shape part may be emulated by a coupled stripline with an equivalent spacing, as another simplified example. In total there are nine 4-port networks that are cascaded for the 20 inch (0.254 m) coupled stripline simulation, each of which is represented in closed forms.

A closed form treatment of the differential via structure is introduced as part of a simulation process. This treatment provides the freedom of separately treating the loss effect and coupling without visible impact on the propagation delay of the via for the given example. More precise treatment may be followed with 3D and full wave simulation or specific measurement, which may or may not, require deembedding.

Differential transmission lines are fully represented in a causal manner analytically using the 4-port S-parameter without concerns of passivity and stability. Even though difficult interconnects such as differential vias are represented in closed forms, the present invention allows those interconnects to be characterized by 4-port S-parameter measurements or 3D modeling. The cascaded multi-port S-parameter approach enables the proposed method to be flexible in dealing with more complex differential interconnects.

The present invention provides explicit mathematical expressions without any fitting algorithms for passive 4-port interconnect systems, hence avoiding convergence, passivity and stability issues inherent with traditional macromodeling approaches. Present precise representations of the physical subject with the frequency-dependent nature are achieved and causality is preserved. Embodiments of the present invention encompass practical high speed differential interconnects including lossy differential transmission lines, vias, connectors and other forms of discontinuities. The present invention utilizes multi-port S-parameter as the solution medium as long as it may be generated by modeling, closed forms or measurement. The 4-port S-parameter may be cascaded directly without using the ABCD matrices or other forms of conversion, hence being more computationally efficient and straightforward.

Figure 9:
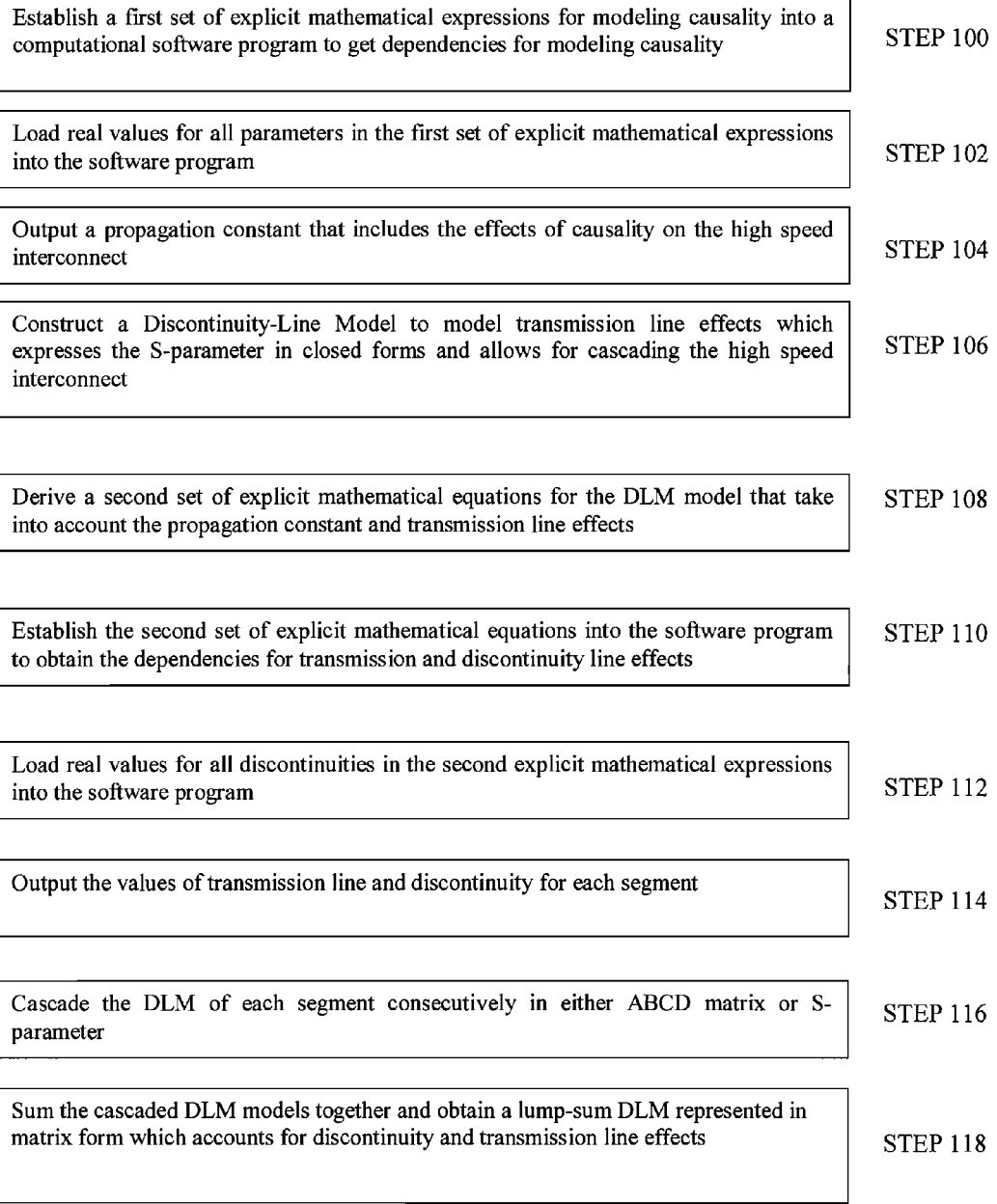
FIG. 9 is a block diagram showing the steps for analyzing high speed interconnects with lossy single-ended lines and discontinuities.

FIG. 9 is a block diagram showing the steps for analyzing high speed interconnects with lossy single-ended lines and discontinuities. In step 100, the user establishes a first set of explicit mathematical expressions for modeling causality into a computational software program to get dependencies for modeling causality. Once the mathematical expressions have been established, the user proceeds to step 102 whereby he loads real values for all parameters in the first set of explicit mathematical expressions into the software program. Next, in step 104, the software program outputs a propagation constant that includes the effects of causality on the high speed interconnect. In step 106, the user constructs a Discontinuity-Line Model to model transmission line effects which expresses the S-parameter in closed forms and allows for cascading the high speed interconnect. Then, in step 108, the user derives a second set of explicit mathematical equations for the DLM model that take into account the propagation constant and transmission line effects. In step 110, the second set of explicit mathematical equations is established to obtain the dependencies for transmission line and discontinuity effects. In step 112, real values for all discontinuities in the second explicit mathematical expressions are loaded into the software program and in step 114 the software program outputs the values of transmission line and discontinuity for each segment. In step 116, the DLM of each segment is consecutively cascaded in either ABCD matrix or S-parameter and in step 118 the cascaded DLM models are summed together to obtain a lump-sum DLM represented in matrix form which accounts for discontinuity and transmission line effects.

FIG. 10 is a block diagram showing the steps for analyzing high speed interconnects with differential lines and discontinuities. In step 200, the user establishes a first set of explicit mathematical expressions for modeling causality into a computational software program to get dependencies for modeling causality. Once the mathematical expressions have been established, the user proceeds to step 202 whereby he loads real values for all parameters in the first set of explicit mathematical expressions into the software program. Next, in step 204, the software program outputs a propagation constant that includes the effects of causality on the high speed interconnect. In step 206, the user constructs a Discontinuity-Line Model to model transmission line effects which expresses the S-parameter in closed forms and allows for cascading the high speed interconnect. Then, in step 208, the user derives a second set of explicit mathematical equations for the DLM model that take into account the propagation constant and transmission line effects, where 4-port configuration and excitation are included. In step 210, the second set of explicit mathematical equations is established to obtain the dependencies for transmission line effects. In step 212, real values for all parameters in the second explicit mathematical expressions are loaded into the software program and in step 214 the software program outputs the values of transmission line and discontinuity for each 4-port segment. In step 216, the 4-port S-parameter of each segment is consecutively cascaded directly and consecutively and in step 218 the cascaded 4-port S-parameter are obtained in matrix form which accounts for propagation and transmission line effects.

It will be understood that each block of the flowchart illustration, and combinations of blocks in the flowchart illustration, may be implemented by computer program instructions. These program instructions may be provided to a processor, such that the instructions, which execute on the processor, create means for implementing the actions specified in the flowchart block or blocks. The computer program instructions may be executed by a processor to cause a series of operational steps to be performed by the processor to produce a computer implemented process such that the instructions, which execute on the processor to provide steps for implementing the actions specified in the flowchart block or blocks. The computer program instructions may also cause at least some of the operational steps shown in the blocks of the flowchart to be performed in parallel. Moreover, some of the steps may also be performed across more than one processor, such as might arise in a multi-processor computer system. In addition, one or more blocks or combinations of blocks in the flowchart illustration may also be performed concurrently with other blocks or combinations of blocks, or even in a different sequence than illustrated without departing from the scope or spirit of the invention.

Accordingly, blocks of the flowchart illustration support combinations of means for performing the specified actions, combinations of steps for performing the specified actions and program instruction means for performing the specified actions. It will also be understood that each block of the flowchart illustration, and combinations of blocks in the flowchart illustration, may be implemented by special purpose hardware-based systems which perform the specified actions or steps, or combinations of special purpose hardware and computer instructions.

The examples provided should not be construed as narrowing the embodiments of the invention, and are intended merely to provide a better understanding. Thus, other mechanisms may therefore be employed, without departing from the scope of the invention.

The above specification, examples, and data provide a complete description of the manufacture and use of the composition of the invention. Since many embodiments of the invention may be made without departing from the spirit and scope of the invention, the invention resides in the claims hereinafter appended.

We claim:

1. A method for modeling a high speed interconnect and transmission line using closed form representations of the S-parameter comprising the steps:
providing computer program instructions to a processor, the processor operable to execute the computer program instructions;
constructing, by the processor executing the computer program instructions, a Discontinuity-Line Model which expresses the S-parameter in closed forms and allows for cascading the high speed interconnect;
deriving, by the processor executing the computer program instructions, an equation for the S-Parameter of the Discontinuity-Line Model which takes into account a propagation constant for the transmission line;
cascading, by the processor executing the computer program instructions, the Discontinuity-Line Model with at least another Discontinuity-Line Model to form a via-line-via model; and
calculating, by the processor executing the computer program instructions, a cascaded S-parameter for the cascaded Discontinuity-Line Model.

2. The method for modeling a high speed interconnect of claim 1 wherein the Discontinuity-Line Model may be applied to both single-ended and differential high speed interconnect systems.

3. The method for modeling a high speed interconnect of claim 1 wherein the step of cascading the Discontinuity-Line Model comprises using the S-parameter obtained from at least one of closed-form representation, measurement, simulation, and 3D modeling.

4. The method for modeling a high speed interconnect of claim 1 wherein the Discontinuity-Line Model is configured for use with a plurality of possible combinations of realistic and complex high speed interconnects.

5. A method for modeling a high speed interconnect comprising the steps of:
on at least one processor operable to execute computer program instructions;
establishing, by the processor executing the computer program instructions, a first set of explicit mathematical expressions for modeling causality into a computational software program running on the at least one processor to obtain dependencies for modeling causality;
loading, by the processor executing the computer program instructions, real values for all parameters in the first set of explicit mathematical expressions into the software program, and the real values obtained from a model circuit,
outputting, by the software program, a complex propagation constant that includes the effects of causality on the high speed interconnect
deriving, by the processor executing the computer program instructions, an equation for the S-Parameter which takes into account the complex propagation constant; and
modeling the high speed interconnect using a closed form expression of the derived S-parameter.

6. The method for modeling a high speed interconnect of claim 5 wherein the complex propagation constant guarantees causality.

7. A method for modeling a high speed interconnect and a transmission line using closed form representations of the S-parameter comprising the steps:
on at least one processor operable to execute computer program instructions;
defining port excitation equations with reference to all ports of a 4-port network;
deriving, by the processor executing the computer program instructions, a matrix representing a summed S-parameter of a discontinuity line model in closed form for the 4-port network and taking into account a propagation constant for the transmission line; cascading, by the processor executing the computer program instructions, the Discontinuity-Line Model with at least another Discontinuity-Line Model to form a via-line-via model; and
providing the port excitation equations and the matrix into a computational software program running on the at least one processor, wherein the software program is operable to calculate a complex propagation constant for the transmission line, and a combined 4-port S-parameter.

8. A method for modeling a high speed interconnect using closed form representations of the S-parameter comprising the steps:
providing computer program instructions to a processor, the processor operable to execute the computer program instructions;
establishing, by the processor executing the computer program instructions, a closed form representation of the S-parameter for a high speed interconnect deriving, by the processor executing the computer program instructions, an equation for the S-Parameter of a Discontinuity-Line Model which takes into account a propagation constant for the transmission line; cascading, by the processor executing the computer program instructions, the Discontinuity-Line Model with at least another Discontinuity-Line Model to form a via-line-via model; and
calculating, by the processor executing the computer program instructions, a timing impairment caused by the interconnect through an analytical treatment of the closed form representation of the S-parameter.

* * * * *